(12) United States Patent
Mori et al.

(10) Patent No.: US 7,762,819 B2
(45) Date of Patent: Jul. 27, 2010

(54) SUBSTRATE CONNECTING MEMBER AND CONNECTING STRUCTURE

(75) Inventors: Masato Mori, Osaka (JP); Yoshihiko Yagi, Hyogo (JP); Masahiro Ono, Osaka (JP); Yoshihiro Tomura, Osaka (JP); Kunio Hibino, Osaka (JP); Yasushi Nakagiri, Kyoto (JP); Akihiro Miyashita, Kanagawa (JP); Kunio Sakurai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/918,121

(22) PCT Filed: Jul. 6, 2006

(86) PCT No.: PCT/JP2006/313466

§ 371 (c)(1),
(2), (4) Date: Feb. 5, 2009

(87) PCT Pub. No.: WO2007/007627

PCT Pub. Date: Jan. 18, 2007

(65) Prior Publication Data

US 2009/0215287 A1    Aug. 27, 2009

(30) Foreign Application Priority Data

Jul. 11, 2005 (JP) .............................. 2005-201491

(51) Int. Cl.
*H01R 12/00* (2006.01)
(52) U.S. Cl. .......................................... 439/66; 439/74
(58) Field of Classification Search .................. 439/65, 439/66, 68–72
See application file for complete search history.

(56) References Cited

U.S. PATENT DOCUMENTS

| 3,924,915 | A | | 12/1975 | Conrad | |
| 5,007,845 | A | * | 4/1991 | Grabbe | 439/73 |
| 5,346,402 | A | * | 9/1994 | Yasuho et al. | 439/71 |

FOREIGN PATENT DOCUMENTS

| JP | 58-95580 | | 6/1983 |
| JP | 58-95580 | U | 6/1983 |

(Continued)

OTHER PUBLICATIONS

Chinese Office Action issued in Chinese Patent Application No. CN 200680011631.7 dated Apr. 3, 2009.

*Primary Examiner*—Ross N Gushi
(74) *Attorney, Agent, or Firm*—McDermott Will & Emery LLP

(57) ABSTRACT

A substrate connecting member connects two circuit boards connected together while maintaining high reliability of the junctions between itself and the circuit boards even if the circuit boards are warped by temperature change of an impact load. The substrate connecting member includes a frame member made of an insulating resin; slit grooves formed in at least one of the inner and outer surfaces of frame side portions composing the frame member, the slit grooves being formed throughout the entire length of the frame side portions in the direction perpendicular to the thickness direction of the frame side portions; and connection conductor portions having connection terminals provided on the top and bottom surfaces, respectively, of the frame side portions in the thickness direction and connecting conductors each connecting connection terminals.

11 Claims, 10 Drawing Sheets

FOREIGN PATENT DOCUMENTS

| | | |
|---|---|---|
| JP | 61-41176 | 2/1986 |
| JP | 62-37887 | 2/1987 |
| JP | 2-53040 | 4/1990 |
| JP | 03-046387 | 2/1991 |
| JP | 6-350214 | 12/1994 |
| JP | 2001-210954 | 8/2001 |
| JP | 2001-339137 | 12/2001 |
| JP | 2002-217514 | 8/2002 |

* cited by examiner

SUBSTRATE CONNECTING MEMBER AND CONNECTING STRUCTURE

RELATED APPLICATIONS

This application is the U.S. National Phase under 35 U.S.C. §371 of International Application No. PCT/JP2006/313466, filed on Jul. 6, 2006, which in turn claims the benefit of Japanese Application No. 2005-201491, filed on Jul. 11, 2005, the disclosures of which Applications are incorporated by reference herein.

TECHNICAL FIELD

The present invention relates to a substrate connecting member which connects, for example, circuit boards together electrically and mechanically.

BACKGROUND ART

Conventionally, when two circuit boards are connected together electrically and mechanically, one circuit board is connected to a male connector having a plug contact, and the other circuit board is connected to a female connector having a socket contact. Then, the male and female connectors are connected to each other.

When housed in an electronic device, the circuit boards thus connected together are subjected to expansion and contraction and hence warpage due to changes in the environmental temperature of the electronic device. If the electronic device is impacted by being dropped or other causes, the circuit boards are subjected to an impact force and hence bending. Such warpage and an impact force cause stress at the junctions between the circuit boards and the connectors. In the case of the aforementioned pair of male and female connectors, the stress is absorbed by the stiffness of the socket contact, which is made of an elastic thin metal sheet.

Such a connection using male and female connectors, however, is high cost because especially the female connector has a complicated structure. In addition, these connectors occupy a large space, so that such a connection is difficult to be applied to an electronic device required to be smaller and thinner.

As another method for connecting circuit boards together, connectors having contact pins are directly connected to circuit boards, which are placed on the top and bottom surfaces of an insulating resin frame. This connection method is also required to reduce stress at the junctions between the circuit boards and the contact pins.

An example of such a connection method to reduce stress is shown in Japanese Patent Unexamined Publication No. S62-37887 which discloses a connector of FIGS. 17 to 19 as a substrate connecting member. FIGS. 17 and 18 are the front view and the plan view of the connector, respectively. FIG. 19 is a sectional view showing a state where a contact pin of the connector is directly soldered to a circuit board.

Connector 92 includes frame 93 having a plurality of contact pins 94 inserted therein. Frame 93 has slit grooves 95, which are formed alternately from both side walls of frame 93 in such a manner as to extend beyond the position of contact pins 94 and to be positioned between contact pins 94. When the electronic device using connector 92 has a temperature change, this may cause the difference in the coefficient of thermal expansion between circuit board 91 and frame 93 and hence stress at soldered portion 96. However, according to the disclosure, slit grooves 95 function to reduce the stress.

In FIG. 19, contact pin 94 projecting from frame 93 is directly connected at its upper portion to another circuit board, which is not illustrated.

In the structure where a frame having contact pins inserted thereinto is provided with slit grooves as described above, the stress caused by the expansion and contraction of circuit boards can be reduced. In the case where the connecting structure of the circuit boards is used in an electronic device and the circuit boards are warped due to temperature changes in the electronic device or bent due to an impact load generated when the electronic device is dropped, stress is applied to the junctions between the circuit boards and the contact pins. The aforementioned structure, however, cannot sufficiently reduce the stress applied to the junctions.

Furthermore, as electronic devices are getting smaller and denser, circuit boards having electronic components mounted thereon are increasingly required to be connected together in a large area. For this reason, circuit boards are required to be connected together throughout their outer peripheral portions. However, in such a connection, the weight of the electronic components mounted on the circuit boards increases the impact load to be applied to the connecting members, thereby possibly damaging the reliability of the junctions.

SUMMARY OF THE INVENTION

An object of the present invention is to provide a substrate connecting member that connects two circuit boards together while maintaining high reliability of the junctions between itself and the circuit boards even if the circuit boards are warped by temperature changes or subjected to an impact load when dropped.

The substrate connecting member of the present invention includes a frame member made of an insulating resin; a slit groove formed in at least one of the inner surface and the outer surface of a frame side portion composing the frame member, the slit groove being formed throughout the entire length of the frame side portion in the direction perpendicular to the thickness direction of the frame side portion; and a connection conductor portion having a connection terminal on the top surface and a connection terminal on the bottom surface, respectively, of the frame side portion in the thickness direction thereof and a connecting conductor connecting the connection terminals.

This structure allows a substrate connecting member having a square frame member to connect two circuit boards together electrically and mechanically, while maintaining the reliability of their junctions. More specifically, when the circuit boards are mounted on an electronic device and warped or bent by being subjected to thermal expansion due to changes in environmental temperature or an impact when dropped, the side walls of the frame side portions in the region of the slit grooves easily deform to absorb the stress. This prevents improper connection of the junctions between the circuit boards and the substrate connecting member, thereby achieving a highly reliable connecting structure.

The substrate connecting member of the present invention may include a frame member made of an insulating resin; a thin-wall portion at both ends of a frame side portion composing the frame member, the thin-wall portion being smaller in thickness than the remaining portion of the frame side portion; and a connection conductor portion having a connection terminal on the top surface and a connection terminal on the bottom surface, respectively, of the frame side portion in the thickness direction thereof, and a connecting conductor connecting the connection terminals.

This structure allows the connection conductor portion to be provided on either the inner surface or the outer surface of the frame side portion, thereby increasing the flexibility of the production of the connection conductor portion. Furthermore, even if the circuit boards are warped or bent due to thermal expansion or an impact, the thin-wall portion elastically deforms to absorb the stress due to the warpage or bending. This greatly reduces the incidence of improper connection of the junctions between the circuit boards and the substrate connecting member, thereby achieving a highly reliable connecting structure.

The connecting structure of the present invention includes two circuit boards each having an electronic component mounted thereon, and a substrate connecting member connecting the two circuit boards together, the substrate connecting member being the aforementioned substrate connecting member.

This structure improves the durability of the connecting structure and allows an electronic device such as a mobile device mounted with the connecting structure to be highly reliable.

Figure 1:
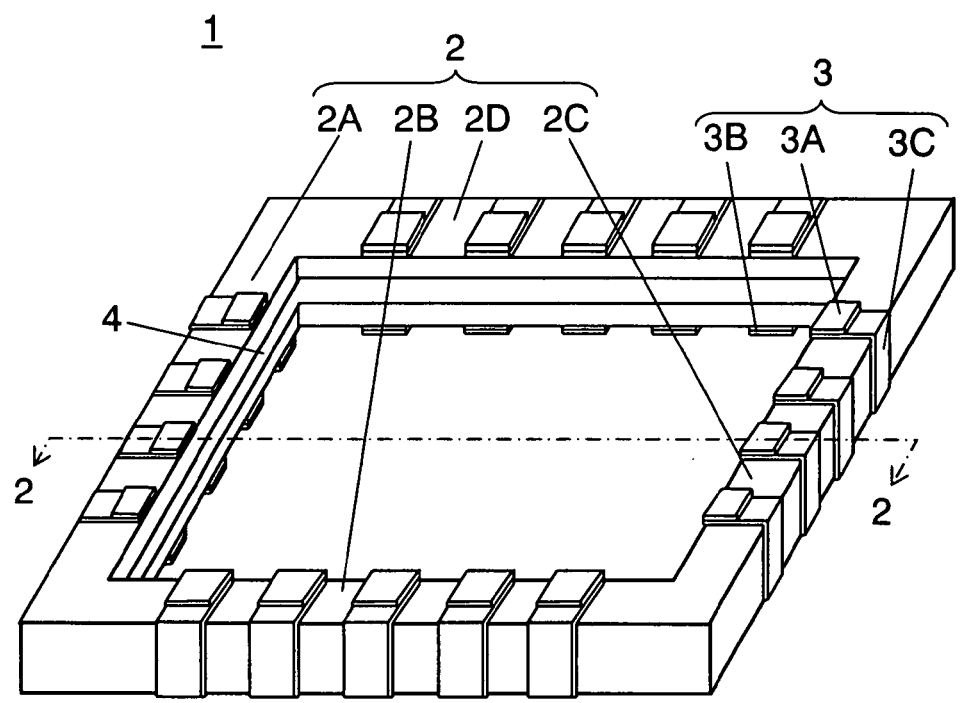
FIG. 1 is an external perspective view of a substrate connecting member according to a first exemplary embodiment of the present invention.

REFERENCE MARKS IN THE DRAWINGS 1, 50, 60, 65, 70, 75 substrate connecting member
2, 62, 66, 71 frame member
2A, 2B, 2C, 2D, 621, 622, 623, 624, 661, 662, 663, 664, 711, 712, 713, 714 frame side portion
3, 63, 67, 72 connection conductor portion
3A, 3B, 63A, 63B, 67A, 72A connection terminal
3C, 63C, 67C, 72C connecting conductor
4, 24, 34, 44, 73, 95 slit groove
5, 25, 35, 45 side wall
10 upper circuit board
11, 16 wiring board
12, 17 electrode terminal
13, 18 electrode component
13A, 13C, 13D, 18A, 18C, 18D semiconductor device
13B, 18B chip component
14, 19 connecting member
15 lower circuit board
24A inner peripheral slit groove
24B outer peripheral slit groove
62, 68 shield conductor
52A, 52B shield connection terminal
62A, 62B, 62C, 62D, 62E, 62F, 62G, 62H, 62J, 62K, 62L, 62M, 66A, 66B, 66C, 66D, 66E, 66F, 66G, 66H, 71A, 71B, 71C, 71D, 71E, 71F, 71G, 71H thin wall portion
91 circuit board
92 connector
93 frame
94 contact pin
96 soldered portion

DETAILED DESCRIPTION OF PREFERRED EMBODIMENTS

Exemplary embodiments of the present invention are described as follows with reference to drawings. The same components are referred to with the same reference numerals in all exemplary embodiments, and the description of these components may be sometimes omitted.

First Exemplary Embodiment

Figure 2:
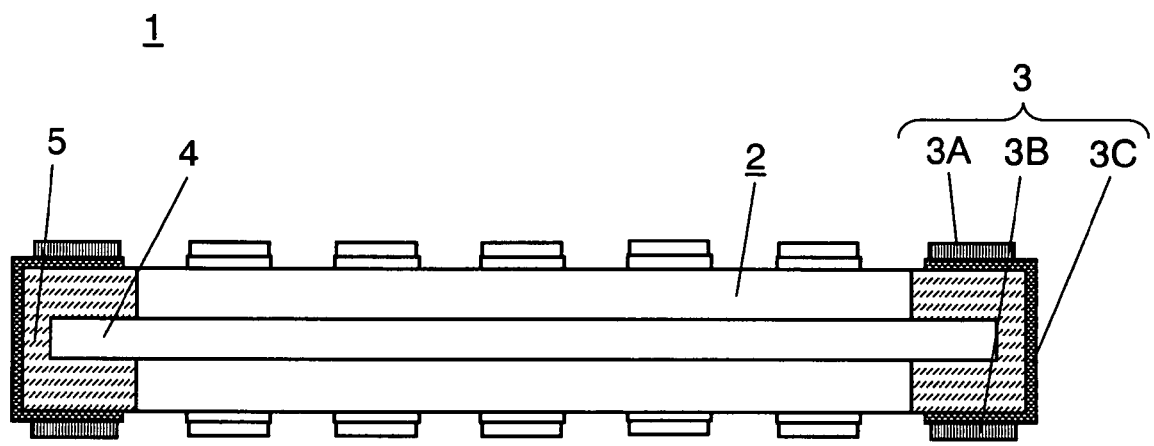
FIG. 2 is a sectional view of the substrate connecting member taken along line 2-2 in FIG. 1 according to the first exemplary embodiment of the present invention.

FIG. 1 is an external perspective view of a substrate connecting member according to a first exemplary embodiment of the present invention, and FIG. 2 is a sectional view taken along line 2-2 in FIG. 1.

Substrate connecting member 1 of the present exemplary embodiment includes frame-like frame member 2 made of insulating resin; slit grooves 4; and connection conductor portions 3 having connection terminals 3A, connection terminals 3B, and connecting conductors 3C. As shown in FIG. 1, the frame member 1 comprises frame side portions having a top surface, a bottom surface, and an inner side surface and an outer side surface. Each of the inner side surface and the outer side surface is orthogonal to the top surface and the bottom surface. Slit grooves 4 are formed in at least one of the inner surface and the outer surface of frame side portions 2A, 2B, 2C, and 2D composing frame member 2 and in the direction perpendicular to the thickness direction of the frame side portions 2A, 2B, 2C, and 2D throughout the entire length thereof. Connection terminals 3A and connection terminals 3B are formed on the top and bottom surfaces, respectively, of the frame side portions in the thickness direction. Connecting conductors 3C each connect connection terminals 3A and 3B.

Connecting conductors 3C of connection conductor portions 3 are formed on the outer surface and slit grooves 4 are formed in the inner surface of frame side portions 2A, 2B, 2C, and 2D.

The present invention, however, is not limited to this structure. For example, connecting conductors 3C of connection conductor portions 3 may be formed on the inner surface and slit grooves 4 may be formed in the outer surface, respectively, of frame side portions 2A, 2B, 2C, and 2D.

The structure of substrate connecting member 1 of the present exemplary embodiment is described in detail as follows. Substrate connecting member 1 are provided on the top and bottom surfaces of each of four frame side portions 2A, 2B, 2C, and 2D composing square frame-like frame member 2 with connection terminals 3A and 3B for connecting circuit boards together. Connecting conductors 3C are formed on the outer surface of each of frame side portions 2A, 2B, 2C, and 2D composing frame member 2 in order to provide electrical continuity between connection terminals 3A and 3B formed on the top and bottom surfaces, respectively. Connection conductor portions 3 are formed of connection terminals 3A and 3B and connecting conductors 3C.

Slit grooves 4 are formed in the inner surfaces of frame side portions 2A, 2B, 2C, and 2D composing frame member 2 throughout the entire length thereof. Frame member 2 is square bracket-shaped in cross section. In this manner, slit grooves 4 are formed to reduce the thickness of side walls 5 of frame side portions 2A, 2B, 2C, and 2D, thereby facilitating elastic deformation of frame side portions 2A, 2B, 2C, and 2D composing frame member 2.

The insulating resin from which frame member 2 is made can be a highly heat-resistant resin such as a liquid crystal polymer or polybutylene terephthalate, or a thermosetting resin.

Connection conductor portions 3 can be formed, for example, by pasting metal foil on the top, bottom, and outer surfaces of each of the frame side portions composing frame member 2 and etching the metal foil. Connection conductor portions 3 are made of a material that performs appropriate elastic deformation. The metal foil to be pasted can be a copper foil having a thickness of, for example, about 35 µm. Alternatively, the copper foil can be plated. In this case, copper, nickel, or a laminated film of them can be plated on the entire surface of frame member 2 and etched. Alternatively, a deposited film or a plating core can be formed in the shape of connection conductor portions 3, and then plated. Connection terminals 3A on the top surface and connection terminals 3B on the bottom surface of each frame side portion are, for example, plated with a metal film for facilitating soldering. The metal film is preferably made of gold (Au), silver (Ag), or solder.

Substrate connecting member 1 of the present exemplary embodiment is structured as described above.

Figure 3:
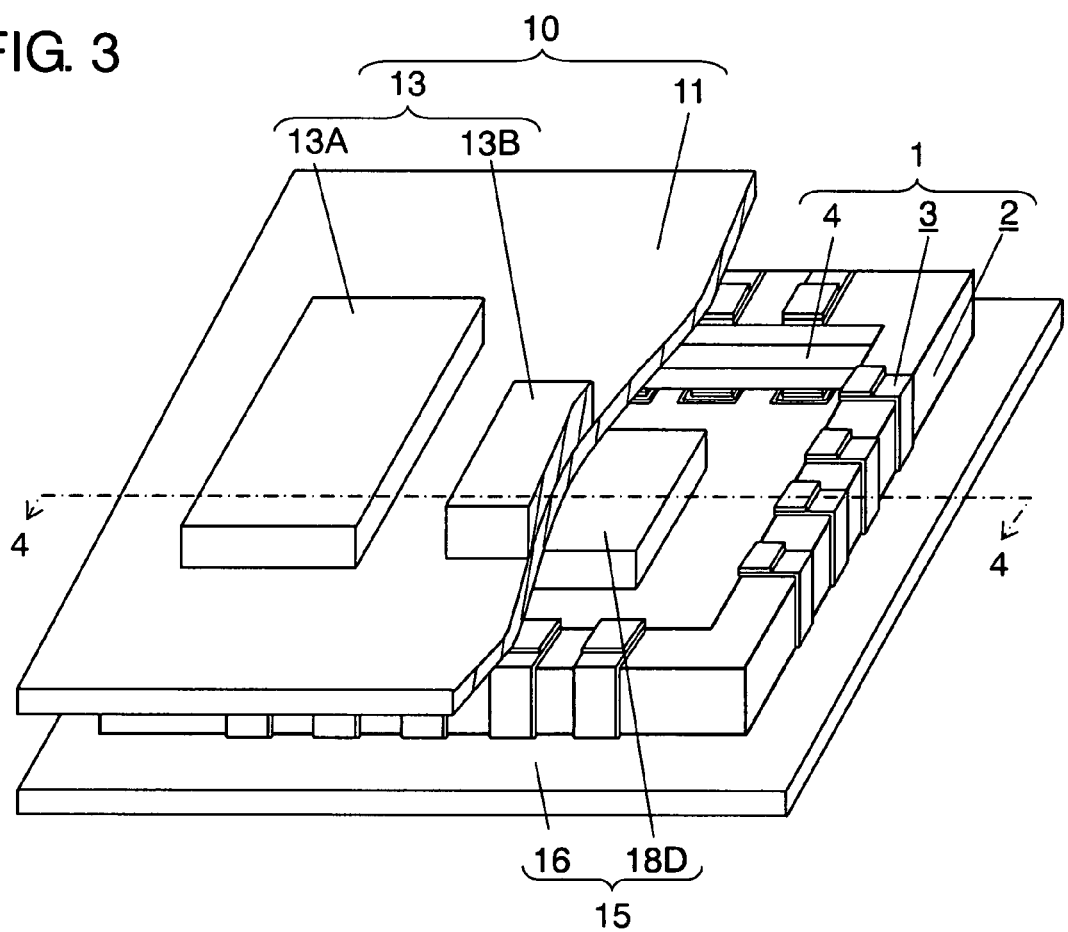
FIG. 3 is a perspective view showing a state in which two circuit boards are connected together using the substrate connecting member according to the first exemplary embodiment of the present invention.
Figure 4:
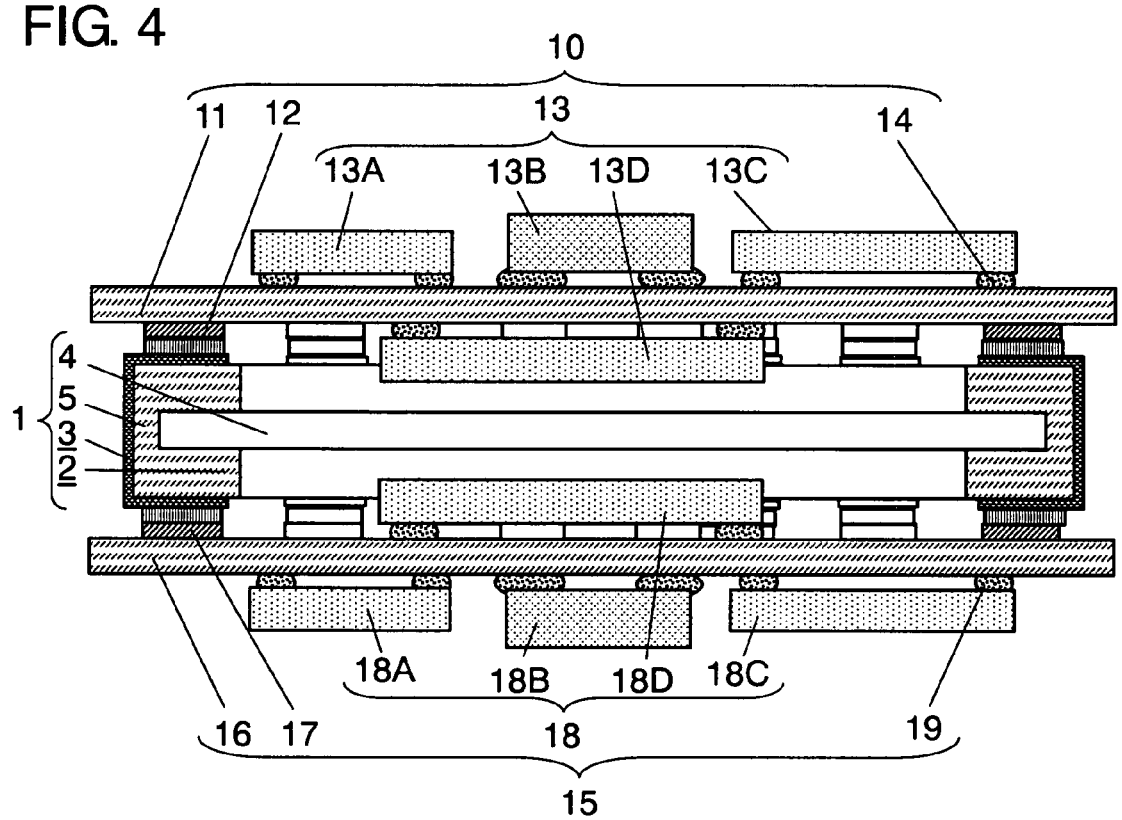
FIG. 4 is a sectional view taken along line 4-4 in FIG. 3 showing a state in which the two circuit boards are connected together using the substrate connecting member according to the first exemplary embodiment of the present invention.

FIG. 3 is a perspective view showing a state in which two circuit boards are connected together using substrate connecting member 1, and FIG. 4 is a sectional view taken along line 4-4 in FIG. 3. In FIG. 3, the upper circuit board is partially cut away so that the connecting structure using substrate connecting member 1 can be understood easily.

Upper circuit board 10 and lower circuit board 15 are connected together using substrate connecting member 1. As shown in FIG. 3, top surfaces of the frame side portions 2A, 2B, 2C and 2D face the upper circuit board 10, and bottom surfaces of the frame side portions face lower circuit board 15. Upper circuit board 10 includes wiring board 11 and electronic components 13 mounted on both sides of wiring board 11.

Electronic components 13 include functional components such as semiconductor devices and passive components such as chip resistors. Electronic components 13 used in the present exemplary embodiment include semiconductor devices 13A and 13C and chip component 13B mounted on one side thereof, and semiconductor device 13D mounted on the other side thereof. These electronic components 13 are electrically connected to wiring board 11 via connecting members 14 made of solder or a conductive adhesive. Wiring board 11 is further provided with electrode terminals 12 so as to be connected to connection terminals 3A provided on the top surface of substrate connecting member 1.

Wiring board 11 may be a double-sided wiring board, but is, in many cases, a multilayer wiring board. In the case of using a multilayer wiring board, electronic components such as passive components and semiconductor devices may be built therein.

In the same manner as upper circuit board 10, lower circuit board 15 includes wiring board 16 and electronic components 18 mounted on both sides of wiring board 16. Electronic components 18 include functional components such as semiconductor devices and passive components such as chip resistors. Electronic components 18 used in the present exemplary embodiment include semiconductor devices 18A and 18C, and chip component 18B mounted on one side thereof, and semiconductor device 18D mounted on the other side thereof. These electronic components 18 are electrically connected to wiring board 16 via connecting members 19 made of solder or a conductive adhesive. Wiring board 16 is further provided with electrode terminals 17 so as to be connected to connection terminals 3B provided on the bottom surface of substrate connecting member 1.

Wiring board 16 may be a double-sided wiring board, but is, in many cases, a multilayer wiring board. In the case of using a multilayer wiring board, electronic components such as passive components and semiconductor devices may be built therein.

In the present exemplary embodiment, each of upper and lower circuit boards 10 and 15 is mounted with electronic components consisting of three semiconductor devices and one chip component. Alternatively, the electronic components may consist of a larger number of semiconductor devices and chip components.

Upper and lower circuit boards 10 and 15 thus structured are connected together using substrate connecting member 1. More specifically, connection terminals 3A on the top surface of each of the frame side portions composing frame member 2 are connected to electrode terminals 12 of upper circuit board 10 via solder or conductive adhesive. Similarly, connection terminals 3B on the bottom surface of each of the frame side portions are connected to electrode terminals 17 of lower circuit board 15 via solder or conductive adhesive. This connection allows upper and lower circuit boards 10 and 15 to be connected together electrically and mechanically at necessary positions.

Figure 5:
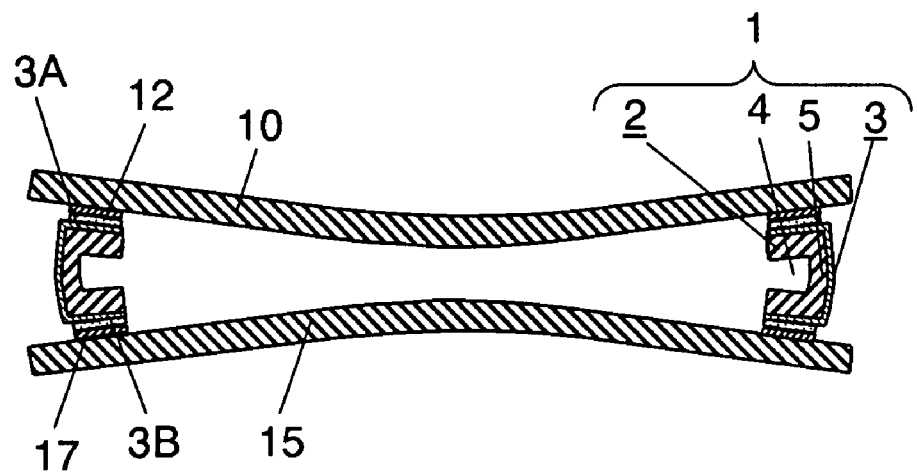
FIG. 5 is a schematic diagram showing a stress buffering effect in the cross section taken along line 4-4 in FIG. 3 when the two circuit boards are connected together using the substrate connecting member according to the first exemplary embodiment of the present invention.
Figure 6:
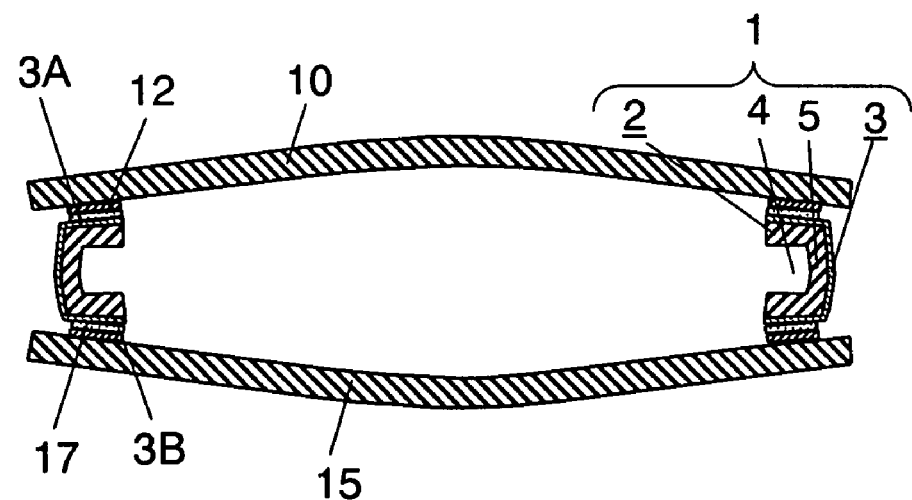
FIG. 6 is another schematic diagram showing a stress buffering effect in the cross section taken along line 4-4 in FIG. 3 when the two circuit boards are connected together using the substrate connecting member according to the first exemplary embodiment of the present invention.
Figure 7:
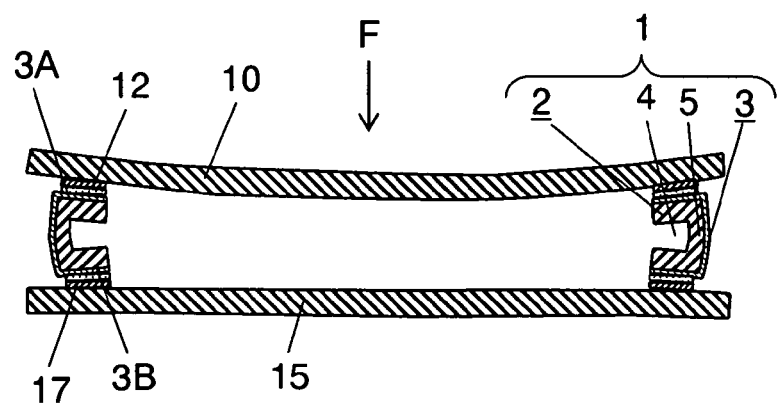
FIG. 7 is a schematic diagram showing a stress buffering effect against an impact force which is applied, for example, when the connecting structure having the two circuit boards connected together using the substrate connecting member according to the first exemplary embodiment of the present invention is mistakenly dropped.

When the connecting structure having upper and lower circuit boards 10 and 15 connected together using substrate connecting member 1 of the present exemplary embodiment is subjected to an external impact or thermally expanded due to heat, the impact force or the stress is buffered as shown in FIGS. 5 to 7.

FIGS. 5 to 7 are schematic diagrams showing a stress buffering effect in the cross section taken along line 4-4 in FIG. 3. In these diagrams, electronic components 13 and 18, which are supposed to be on upper and lower circuit boards 10 and 15, respectively, are not illustrated for easier explanation.

As shown in FIGS. 5 and 6, upper and lower circuit boards 10 and 15 are warped in and around the center of frame member 2 of substrate connecting member 1 due to an external load or heat generated in upper and lower circuit boards 10 and 15. More exactly, the heat is generated from electronic components 13 and 18 mounted on upper and lower circuit boards 10 and 15, respectively. When the connecting structure shown in FIG. 3 is mounted on an electronic device, such warpage can be caused by the difference in thermal expansion between upper and lower circuit boards 10, 15 and substrate connecting member 1 due to changes in the environmental temperature of the electronic device. Even if such warpage is caused, slit grooves 4 formed in frame member 2 allow side walls 5 to deform elastically. This reduces the stress applied to the junctions between connection terminals 3A of substrate connecting member 1 and electrode terminals 12 of upper circuit board 10 and the junctions between connection terminals 3B and electrode terminals 17 of lower circuit board 15. As a result, the incidence of improper connection, of the junctions is greatly reduced.

FIG. 7 is a schematic diagram showing a stress buffering effect against an impact force which is applied, for example, when the connecting structure is mistakenly dropped. As shown in FIGS. 3 and 4, upper and lower circuit boards 10 and 15 are mounted with many electronic components in the inner region of substrate connecting member 1. In addition, the wiring boards used for these electronic components are very thin, so that when dropped and impacted, the circuit boards are warped by impact force F.

In the case of FIG. 7, lower circuit board 15 is prevented from being warped by an unillustrated housing or the like, and only upper circuit board 10 is warped. Even if such warpage is caused, slit grooves 4 formed in frame member 2 of substrate connecting member 1 allow side walls 5 to deform elastically. This reduces the stress applied to the junctions between connection terminals 3A of substrate connecting member 1 and electrode terminals 12 of upper circuit board 10 and the junctions between connection terminals 3B and electrode terminals 17 of lower circuit board 15. As a result, the incidence of improper connection of the junctions is effectively reduced.

When held away from the housing or the like, lower circuit board 15 is warped in the same direction as upper circuit board 10. Even if such warpage is caused, frame member 2 of substrate connecting member 1 elastically deforms in the same manner as above, thereby reducing the stress applied to the junctions.

In the present exemplary embodiment, slit grooves 4 are formed in the inner peripheral region of frame member 2 of substrate connecting member 1, but the present invention is not limited to this structure. In the case where connection conductor portions 3 are formed in the inner peripheral region of frame member 2, slit grooves 4 may be formed in the outer peripheral region of frame member 2. This structure can provide the same advantages as in the aforementioned structure.

Figure 8:
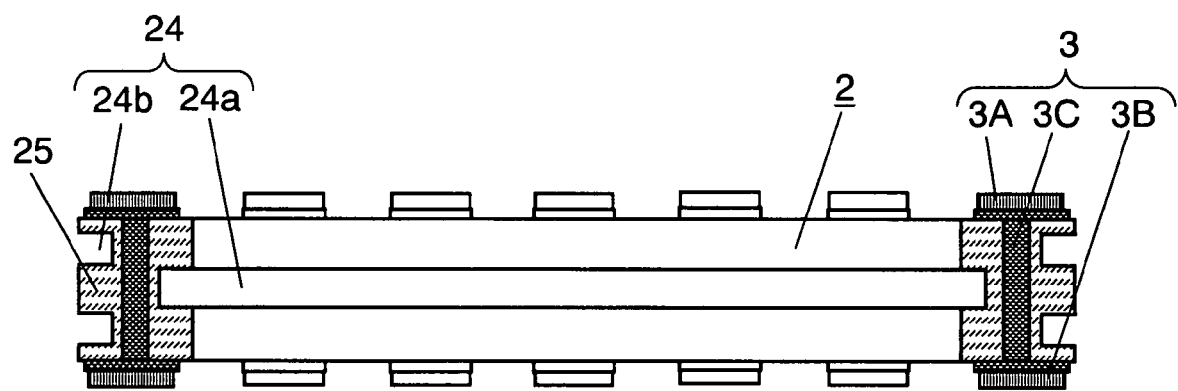
FIG. 8 is a sectional view of a structure in which connecting conductors of connection conductor portions are buried in the approximate center region of the frame member in the width direction and a slit groove is formed in both the inner and outer peripheral regions of the frame member in the first exemplary embodiment of the present invention.

Alternatively, as shown in FIG. 8, it is possible to form slit grooves 24 both in the inner and outer peripheral regions of frame member 2 when connecting conductors 3C are buried in the approximate center region of frame member 2 in the width direction, and connection terminals 3A and 3B provided on the top and bottom surfaces, respectively, of frame member 2 are connected to each other via connecting conductors 3C. In FIG. 8, one inner peripheral slit groove 24A is formed in the inner peripheral region, and two outer peripheral slit grooves 24B are formed in the outer peripheral region. As a result, side walls 25 can effectively absorb the stress.

Figure 9:
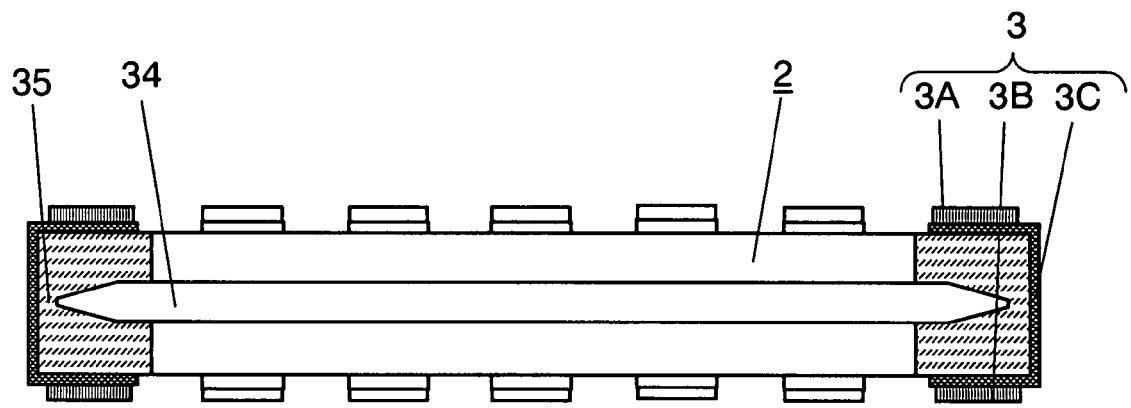
FIG. 9 is a sectional view of a substrate connecting member having a V-shaped slit groove as a first another example of the substrate connecting member according to the first exemplary embodiment of the present invention.

Slit grooves 4 to be formed in frame member 2 of substrate connecting member 1 are not limited to the shape shown in FIG. 2. For example, V-shaped slit grooves 34 as shown in FIG. 9 can be formed. Forming V-shaped slit grooves 34 makes it easy for side walls 35 to elastically deform and to effectively absorb stress due to warpage, if any.

Figure 10:
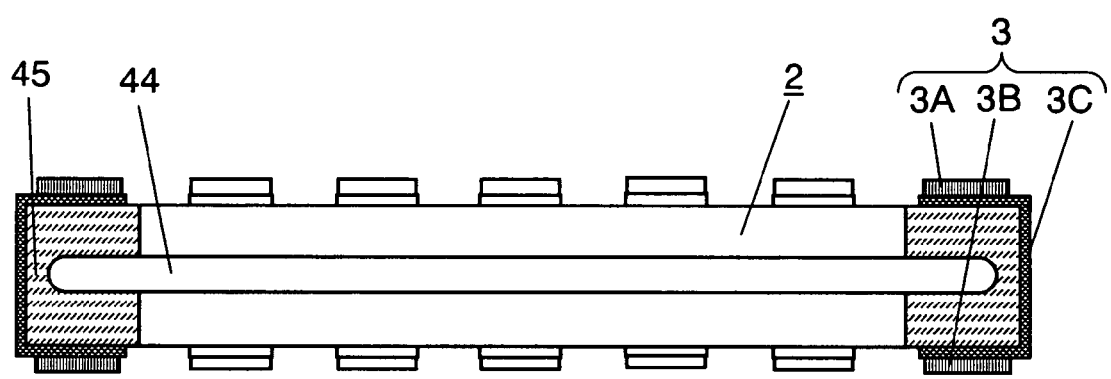
FIG. 10 is a sectional view of a substrate connecting member having a U-shaped slit groove as a second another example of the substrate connecting member according to the first exemplary embodiment of the present invention.

Alternatively, U-shaped slit grooves 44 as shown in FIG. 10 can be formed. Forming such slit grooves 44 makes it easy for side walls 45 to elastically deform and to effectively absorb stress due to warpage, if any.

In the case of having the slit grooves shown in FIGS. 9 and 10, side walls 35 and 45 do not cause stress concentration even if they elastically deform, thereby facilitating the prevention of cracks and other problems.

Slit grooves 4, 24, 34, and 44 shown in FIGS. 1, 8, 9, and 10, respectively, are empty spaces. It is possible to fill the empty spaces with a soft material having rubber elasticity such as natural rubber. The space filled with a soft material having rubber elasticity can maintain the stress reducing effect and, in addition, prevent the entry of dust and the like. Furthermore, the material having rubber elasticity can protect the slit grooves from scratches when the circuit boards are connected together using substrate connecting member 1. This achieves a highly reliable connecting structure that does not cause cracks or other problems when it is subjected to repeated elastic deformation. Beside natural rubber, examples of the material having rubber elasticity include silicone rubber, butyl rubber, urethane rubber, chloroprene rubber, styrene-butadiene rubber, ethylene propylene rubber, fluororubber, and nitrile rubber.

Of the frame side portions of the frame member of the substrate connecting member, opposing frame side portions are preferably provided with the same number of connection terminals so as to approximately equalize the load to be applied to frame member 2 due to thermal expansion or an impact. This can increase the connection strength and maintain reliability of the junctions when there is warpage or other problems. For this reason, it is preferable to have the same number of connection terminals by providing dummy connection terminals, which are useless for electrical connection.

The frame side portions of frame member 2 do not need to have a width larger than necessary for the connection terminals. Frame member 2 can have any thickness; however, when it has a large thickness, more than one slit groove can be formed.

As described hereinbefore, when two circuit boards connected together using the substrate connecting member of the present exemplary embodiment are warped or bent due to thermal expansion or an impact force, the side walls in the region of the slit grooves formed in the frame member of the substrate connecting member elastically deform to reduce the stress effectively. This achieves a highly reliable connecting structure that is not susceptible to improper connection or other problems of the junctions.

Second Exemplary Embodiment

Figure 11A:
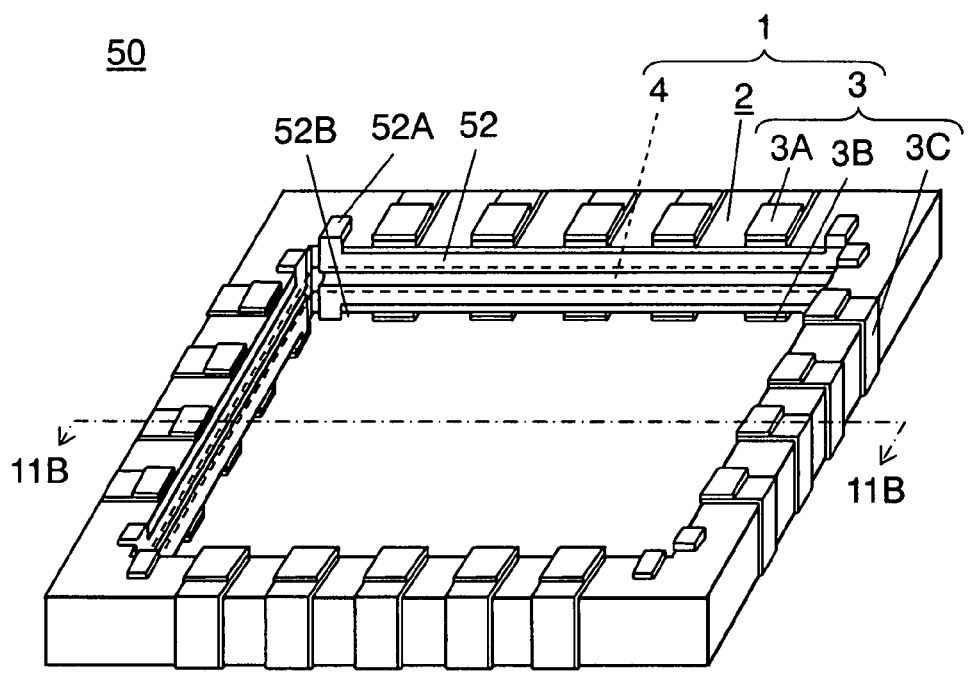
FIG. 11A is an external perspective view of a substrate connecting member according to a second exemplary embodiment of the present invention.
Figure 11B:
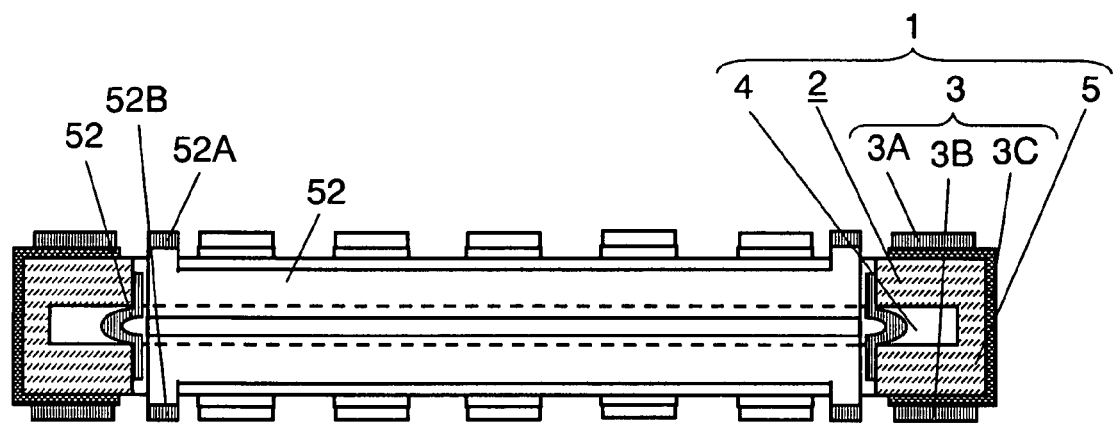
FIG. 11B is a sectional view of the substrate connecting member taken along line 11B-11B in FIG. 11A according to the second exemplary embodiment of the present invention.

FIGS. 11A and 11B show the structure of substrate connecting member 50 according to a second exemplary embodiment of the present invention. FIG. 11A is a perspective view of substrate connecting member 50 and FIG. 11B is a sectional view taken along line 11B-11B in FIG. 11A.

Substrate connecting member 50 of the present exemplary embodiment differs from substrate connecting member 1 of the first exemplary embodiment in providing shield conductors 52 to coat the regions having slit grooves 4. More specifically, in substrate connecting member 50 of the present exemplary embodiment, each of the frame side portions composing frame member 2 has shield conductor 52 on a side opposite to the side having connecting conductors 3C thereon. Shield conductors 52 have shield connection terminals 52A on the same side as connection terminals 3A, and shield connection terminals 52B on the same side as connection terminals 3B of connection conductor portions 3.

Shield conductors 52 can be easily formed by processing and pasting a metal foil such as copper (Cu) or nickel (Ni). Shield conductors 52 are provided with shield connection terminals 52A and 52B extending up to the same side as connection terminals 3A and 3B of connection conductor portions 3. Shield connection terminals 52A and 52B are connected to shielding electrode terminals (unillustrated), which are formed on the upper and lower circuit boards (unillustrated), respectively.

As a result, various electronic components mounted inside frame member 2 of substrate connecting member 50 can be effectively shielded from electromagnetic noise.

Shield conductors 52 are partially folded into slit grooves 4 as shown in FIG. 11B. Therefore, even if at least one of the upper and lower circuit boards is bent as described in the first exemplary embodiment, it does not hinder elastic deformation of side walls 5 in the region of slit grooves 4 formed in substrate connecting member 50. This achieves a connecting structure that has an electromagnetic shielding effect and is resistant to thermal expansion and impact.

In the present exemplary embodiment, slit grooves 4 are formed in the inner peripheral region of frame member 2 of substrate connecting member 50; however, the present invention is not limited to this structure. Alternatively, connection conductor portions 3 can be formed in the inner peripheral region and slit grooves 4 can be formed in the outer peripheral region of frame member 2 and coated with shield conductors 52.

As shown in FIG. 8, shield conductors 52 can be formed either in the inner or outer peripheral region of frame member 2 when connecting conductors 3C of connection conductor portions 3 are buried in the approximate center region of frame member 2 in the width direction, and connection terminals 3A and 3B on the top and bottom surfaces, respectively, of frame member 2 are connected to each other via connecting conductors 3C.

In the present exemplary embodiment, shield conductors 52 provided in the inner peripheral region of frame member 2 of substrate connecting member 50 are independently formed in each frame side portion; however, the present invention is not limited to this structure. Alternatively, shield conductors 52 can be previously processed into the same shape as the inner peripheral region of frame member 2 and pasted thereon.

Third Exemplary Embodiment

Figure 12:
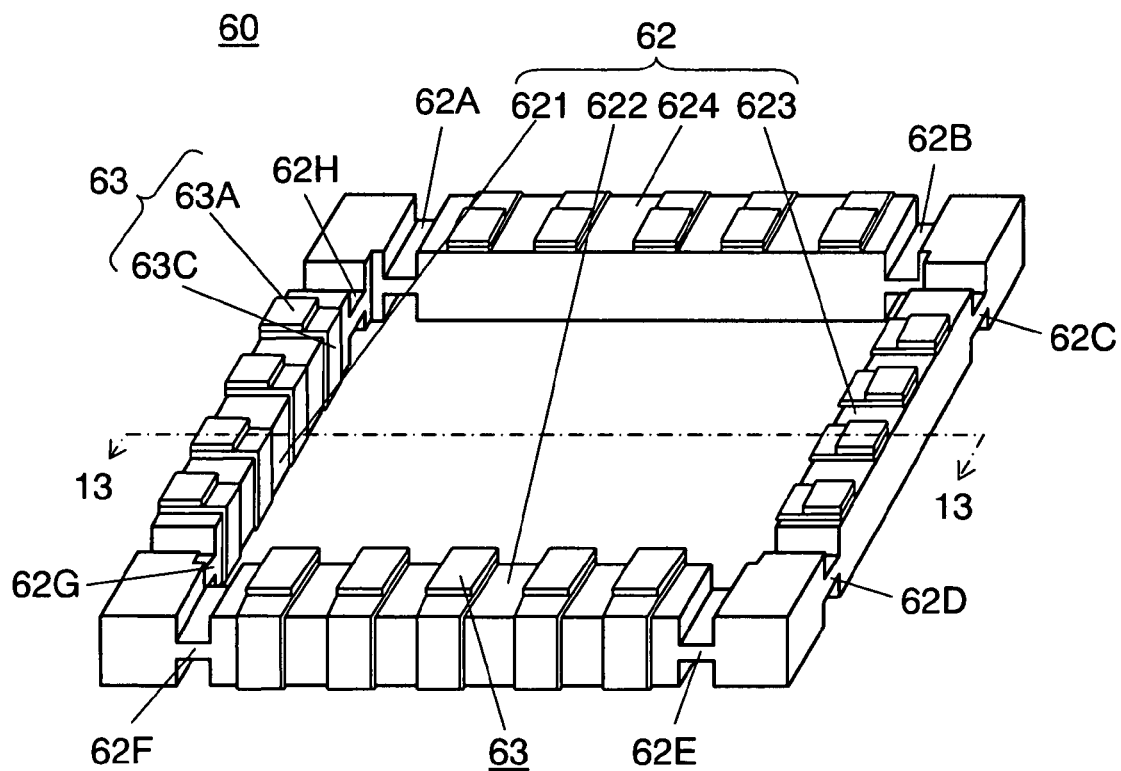
FIG. 12 is an external perspective view of a substrate connecting member according to a third exemplary embodiment of the present invention.

FIG. 12 is an external perspective view of substrate connecting member 60 according to a third exemplary embodiment of the present invention. Substrate connecting member 60 includes frame-like frame member 62 made of insulating resin; thin-wall portions 62A and 62B, 62C and 62D, 62E and 62F, and 62G and 62H, which are formed on both ends of four frame side portions 624, 623, 622, and 621, respectively, composing frame member 62 and are thinner than the remaining portion of the frame side portions; and connection conductor portions 63 having connection terminals 63A, connection terminals 63B, and connecting conductors 63C. Connection terminals 63A and connection terminals 63B (shown in FIG. 13) are formed on the top and bottom surfaces, respectively, of frame side portions 621, 622, 623, and 624 in the thickness direction. Connecting conductors 63C each connect connection terminals 63A and 63B.

The structure of substrate connecting member 60 of the present exemplary embodiment is described in detail as follows. Frame side portions 621, 622, 623, and 624 composing frame member 62 are provided at both sides thereof with thin-wall portions 62G and 62H, 62E and 62F, 62C and 62D, and 62A and 62B, respectively. Connection conductor portions 63 include connection terminals 63A and connection terminals 63B (shown in FIG. 13) formed on the top and bottom surfaces, respectively, of frame side portions 621, 622, 623, and 624 and connecting conductors 63C each connecting connection terminals 63A and 63B.

In the present exemplary embodiment, of frame side portions 621, 622, 623, and 624 composing frame member 62, opposing frame side portions are provided with the same shape of connection conductor portions 63 as each other. For example, connecting conductors 63C of connection conductor portions 63 are formed in the inner peripheral region of frame side portions 621 and 623 shown on the left and right sides in FIG. 12, and are formed in the outer peripheral region of frame side portions 622 and 624 shown on the top and bottom sides in FIG. 12. However, the present invention is not limited to this structure. Connecting conductors 63C of connection conductor portions 63 may be, for example, all formed in the inner peripheral region or all formed in the outer peripheral region.

In substrate connecting member 60 of the present exemplary embodiment, thin-wall portions 62A, 62B, 62C, 62D, 62E, 62F, 62G, and 62H are easily elastically deformable. This structure effectively prevents the incidence of improper connection of the junctions when circuit boards connected together are warped due to thermal expansion or an impact force.

Frame member 62 and connection conductor portions 63 of substrate connecting member 60 of the present exemplary embodiment can be made of the same materials as frame member 2 and connection conductor portions 3, respectively, described in the first exemplary embodiment, so that the description of the materials is omitted.

Figure 13:
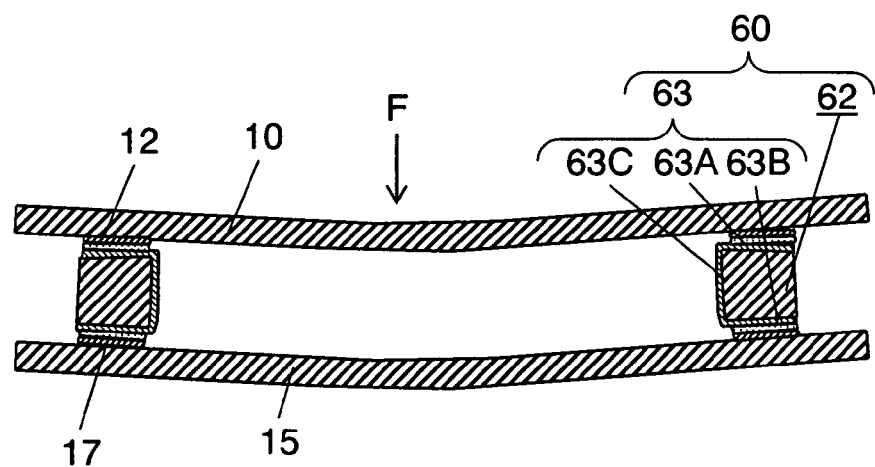
FIG. 13 is a sectional view taken along line 13-13 in FIG. 12 to show a stress reducing effect at junctions when an impact force is applied to a connecting structure in which an upper circuit board and a lower circuit board are connected together using the substrate connecting member according to the third exemplary embodiment of the present invention.

FIG. 13 is a schematic sectional view showing a stress reducing effect at junctions when an impact force is applied to a connecting structure in which upper and lower circuit boards 10 and 15 described in the first exemplary embodiment are connected together using substrate connecting member 60. The sectional view of FIG. 13 is taken along line 13-13 when the connecting structure is formed using substrate connecting member 60 shown in FIG. 12.

When the connecting structure having upper and lower circuit boards 10 and 15 connected together using substrate connecting member 60 is held in the hollow space of the housing or the like of an electronic device, if external impact force F is applied to the connecting structure, upper and lower circuit boards 10 and 15 are warped in the same direction by impact force F. At the same time, thin-wall portions 62A, 62B, 62C, 62D, 62E, 62F, 62G, and 62H formed in frame member 62 of substrate connecting member 60 deform elastically. This effectively reduces the incidence of improper connection of the junctions between electrode terminals 12 of upper circuit board 10 and connection terminals 63A on the top surface and the junctions between electrode terminals 17 of lower circuit board 15 and connection terminals 63B on the bottom surface. As a result, the connecting structure can be highly reliable against impact or the like.

In the present exemplary embodiment, thin-wall portions 62A, 62B, 62C, 62D, 62E, 62F, 62G, and 62H are formed in the direction perpendicular to the thickness direction of frame member 62; however, the present invention is not limited to this structure. These thin-wall portions may be formed to be thin, for example, in the direction parallel and/or perpendicular to the thickness direction.

In the present exemplary embodiment, thin-wall portions 62A, 62B, 62C, 62D, 62E, 62F, 62G, and 62H are provided with stepped portions, which may be filled with a material having rubber elasticity such as urethane rubber. This structure allows each of the top and bottom surfaces of the frame side portions composing the frame member to be entirely flat so as to make the frame member easy to handle. Furthermore, the material having rubber elasticity can protect the slit grooves or the thin-wall portions from scratches when the circuit boards are connected together using the substrate connecting member. This achieves a highly reliable connecting structure that does not cause cracks or other problems when it is subjected to repeated elastic deformation.

In the present exemplary embodiment, each frame side portion may have a shield conductor on a side opposite to the side having the connecting conductors thereon and have the shield connection terminals of the shield conductors on the same side as the connection terminals of the connection conductor portions. As a result, various electronic components mounted in the inner peripheral region of the substrate connecting member can be shielded from electromagnetic noise.

Figure 14:
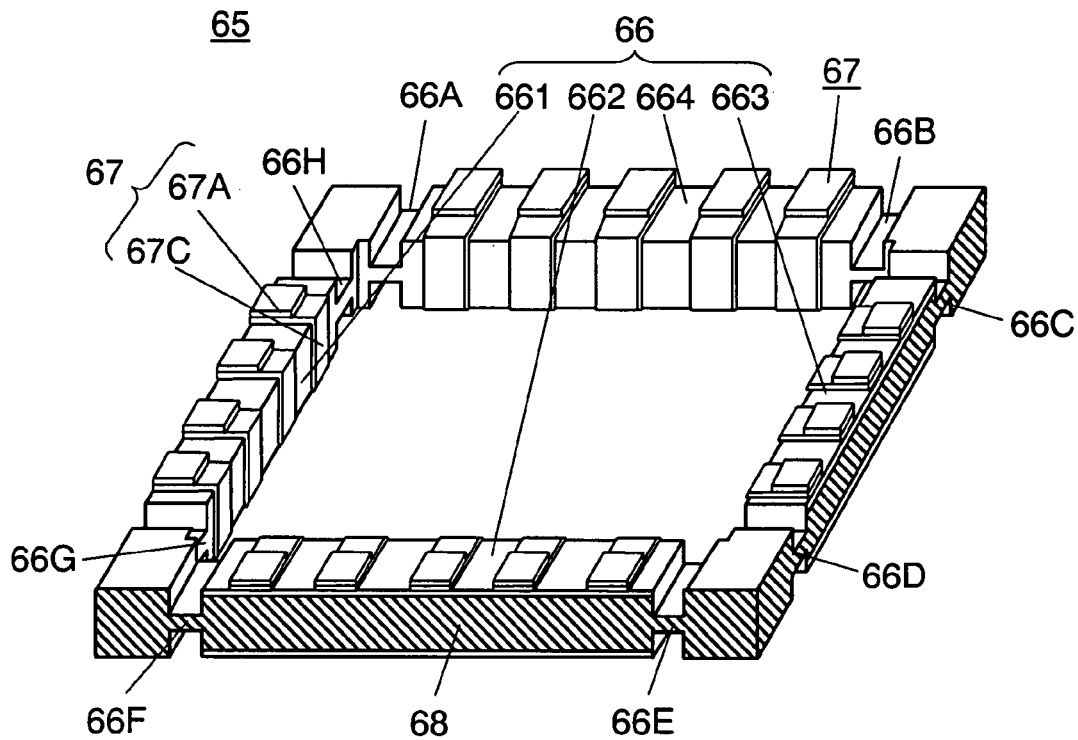
FIG. 14 is an external perspective view of a substrate connecting member in which each frame side portion has a thin-wall portion at both ends thereof and a shield conductor for electromagnetic shielding at the outer surface thereof.

One such example is shown in FIG. 14. Substrate connecting member 65 includes frame member 66 having frame side portions 661, 662, 663, and 664 which are provided at both ends thereof with thin-wall portions 66G and 66H, 66E and 66F, 66C and 66D, and 66A and 66B, respectively. Substrate connecting member 65 further includes connection conductor portions 67 having connection terminals 67A and connection terminals (unillustrated) formed on the top and bottom surfaces, respectively, of substrate connecting member 65, and connecting conductors 67C connecting these connection terminals. Frame side portions 661, 662, 663, and 664 of frame member 66 are provided on the inner surface thereof with connecting conductors 67C and on the outer surface thereof with shield conductors 68 for electromagnetic shielding. In the example shown in FIG. 14, shield conductors 68 are plated on the outer surfaces of frame side portions 661, 662, 663, and 664. Alternatively, shield conductors 68 can be formed by pasting a copper foil or the like in the same manner as in the second exemplary embodiment.

Shield conductors 68 are required to be formed out of electric contact with connection terminals 67A on the top surface and the connection terminals on the bottom surface. It is also necessary to provide shield connection terminals on at least one of the top and bottom surfaces of the frame side portions via shield conductors 68 so as to connect the shield connection terminals to the ground terminal of the circuit boards. The shield connection terminals are not illustrated.

In the present exemplary embodiment, of frame side portions 661, 662, 663, and 664, opposing frame side portions can be provided with the same number of connection terminals. This structure allows the junctions of the substrate connecting member to be uniformly subjected to stress when the circuit boards are warped or bent due to thermal expansion or an impact. As a result, the incidence of improper connection of the junctions can be reduced.

Figure 15:
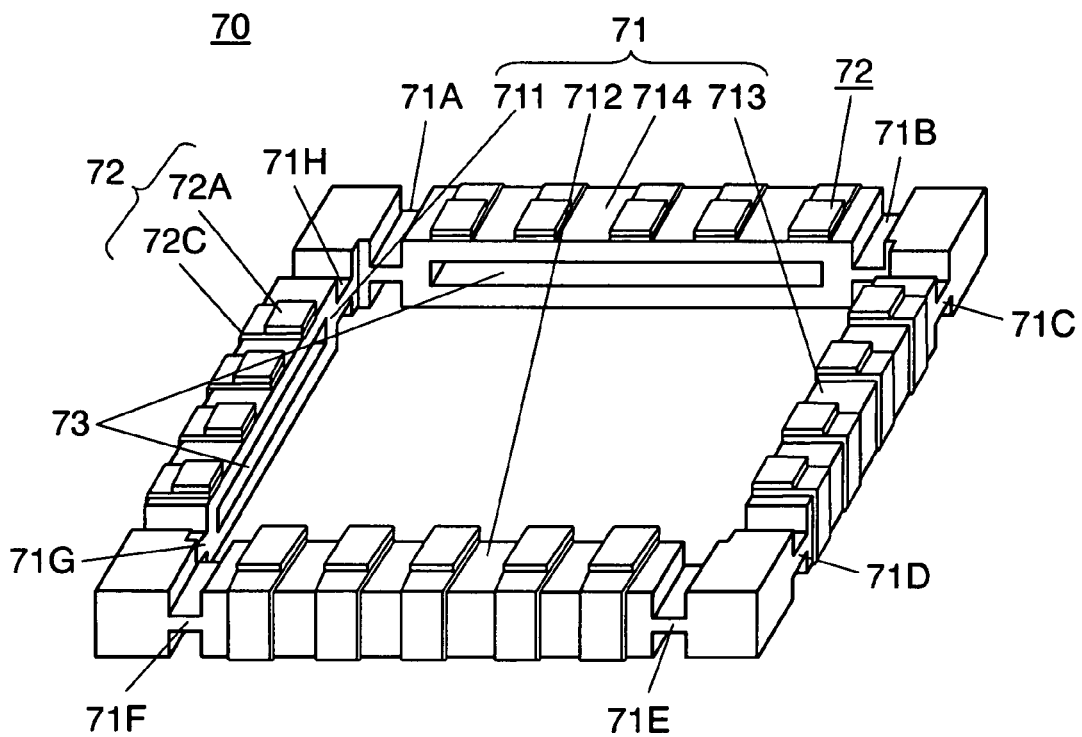
FIG. 15 is an external perspective view of a substrate connecting member, which is based on the substrate connecting member of the third exemplary embodiment and additionally provided with slit grooves.

FIG. 15 is an external perspective view of substrate connecting member 70 which is based on substrate connecting member 60 of the third exemplary embodiment and additionally provided with slit grooves. Substrate connecting member 70 includes frame-like frame member 71 made of insulating resin; thin-wall portions 71A and 71B, 71C and 71D, 71E and 71F, and 71G and 71H, which are formed on both ends of four frame side portions 714, 713, 712, and 711, respectively, composing frame member 71 and are thinner than the remaining portion of the frame side portions; connection conductor portions 72 having connection terminals 72A, connection terminals (unillustrated), and connecting conductors 72C; and slit grooves 73. Connection terminals 72A and the unillustrated connection terminals are formed on the top and bottom surfaces, respectively, of the frame side portions in the thickness direction. Connecting conductors 72C each connect the connection terminals. Slit grooves 73 are formed in the inner peripheral region of frame side portions 711, 712, 713, and 714 composing frame member 71.

As apparent from FIG. 15, slit grooves 73 are formed by making slits in the regions of frame side portions 711, 712, 713, and 714 that exclude thin-wall portions 71A, 71B, 71C, 71D, 71E, 71F, 71G, and 71H. Forming slit grooves 73 allows the side walls in addition to thin-wall portions 71A, 71B, 71C, 71D, 71E, 71F, 71G, and 71H to elastically deform, thereby making it easier to absorb the stress caused by an impact force or thermal expansion. This further reduces improper connection, thereby achieving a highly reliable connecting structure.

Figure 16:
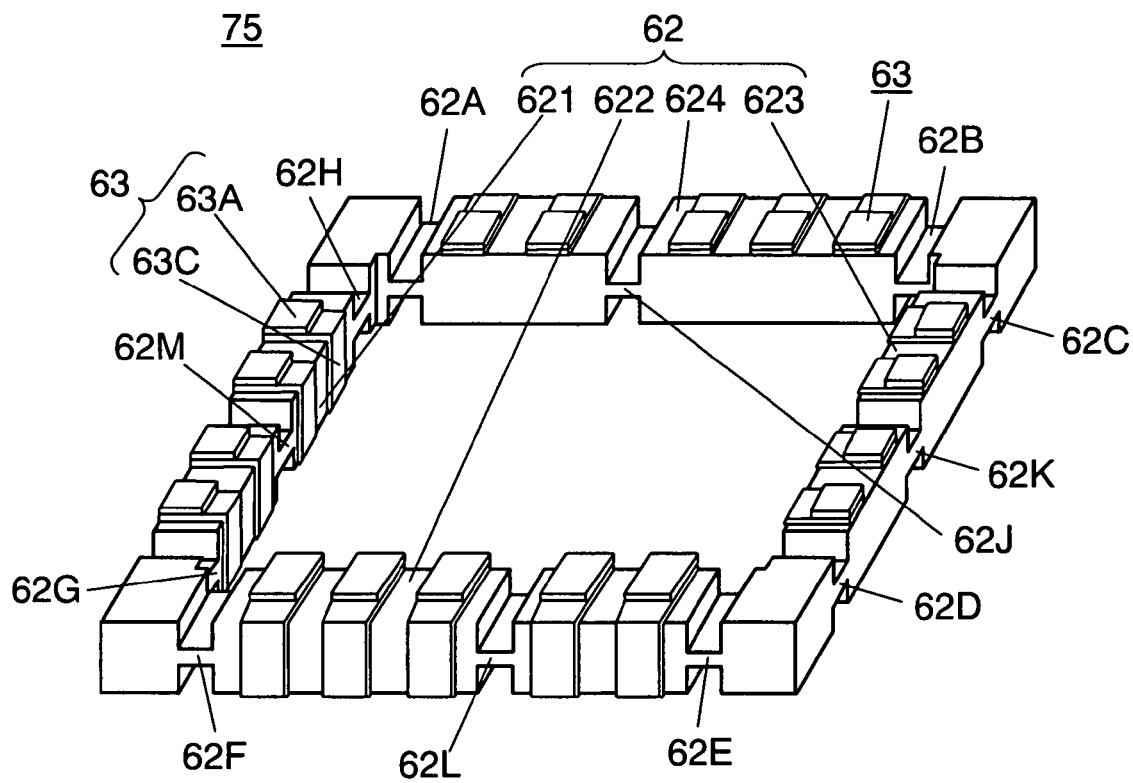
FIG. 16 is an external perspective view of a substrate connecting member, which is based on the substrate connecting member of the third exemplary embodiment and provided with additional thin-wall portions between the connection terminals of frame side portions.
Figure 17:
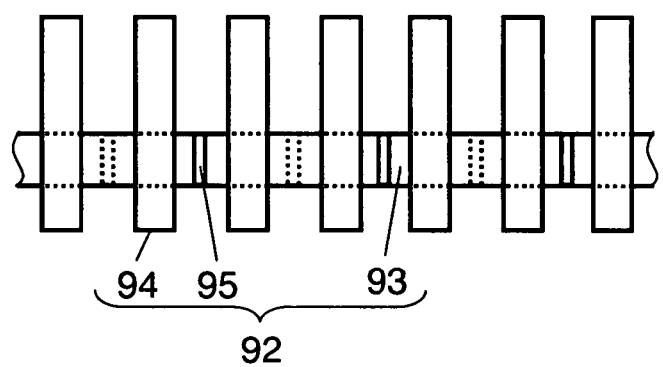
FIG. 17 is a front view of a conventional connector for stress reduction.
Figure 18:
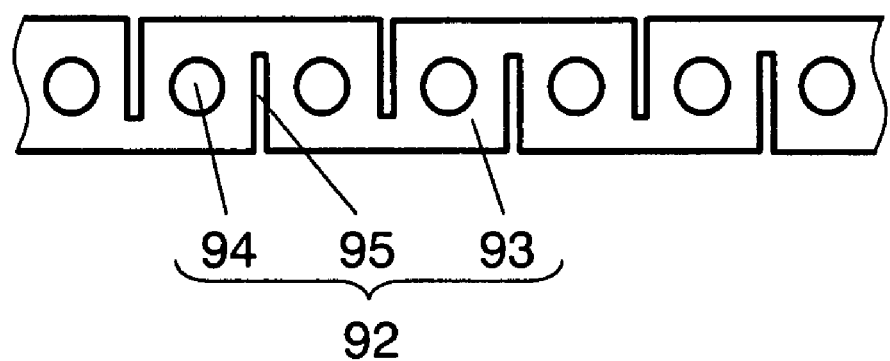
FIG. 18 is a plan view of the conventional connector.
Figure 19:
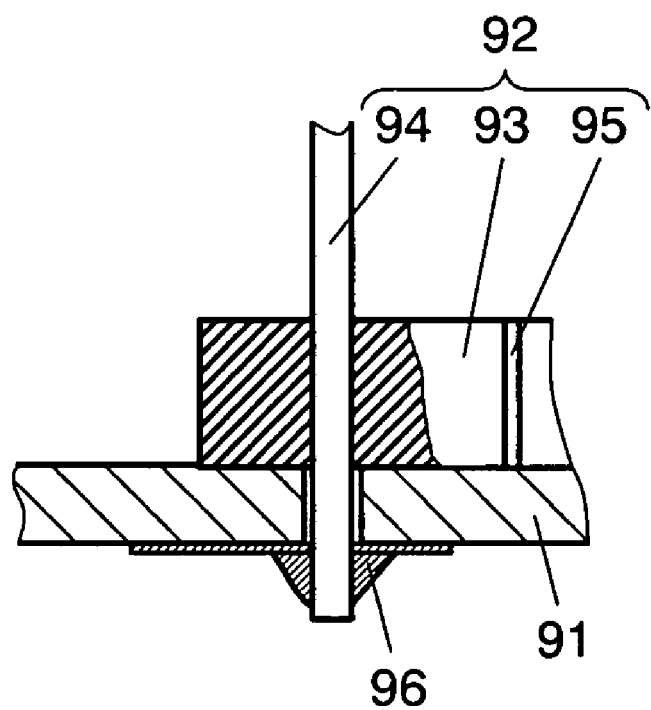
FIG. 19 is a sectional view of the conventional connector in which contact pins are directly soldered to the circuit boards.

FIG. 16 is an external perspective view of substrate connecting member 75, which is based on substrate connecting member 60 of the third exemplary embodiment and provided with additional thin-wall portions between connection conductor portions 63 of frame side portions 621, 622, 623, and 624. Forming at least one thin-wall portion between connection conductor portions 63 of each of frame side portions 621, 622, 623, and 624 allows frame side portions 621, 622, 623, and 62 to deform more flexibly and to absorb greater stress. As a result, a more reliable connecting structure can be achieved. More specifically, as shown in FIG. 16, frame side portions 621, 622, 623 and 624 are provided with thin-wall portions 62M, 62L, 62K, and 62J, respectively in the region having connection conductor portions 63.

The present invention is not limited to the scope described in the first to third exemplary embodiments. For example, of the four frame side portions composing the frame member, one set of two adjacent or opposing frame side portions may be made of a material and the other set of two adjacent or opposing frame side portions may be made of another material. For example, so-called two-color injection molding can be performed using two resin materials having different Young's modulus from each other. In the case where two sets of two opposing frame side portions are made of different resin materials from each other, even if the slit grooves or the thin-wall portions are reduced in size, the same effects can be obtained because the frame member itself is elastically deformed. As a result, the frame member can be reduced in width.

As described hereinbefore, according to the present invention, when two circuit boards are connected together at a large area such as their outer peripheral regions, the junctions between the circuit boards and the substrate connecting member can maintain the reliability, thereby achieving a high-performing and highly reliable connecting structure.

INDUSTRIAL APPLICABILITY

The substrate connecting member of the present invention connects two circuit boards at their outer peripheral regions. When the two circuit boards are warped or bent due to thermal expansion or an impact, the substrate connecting member reduces stress caused by the warpage or bending so as to prevent improper connection of the junctions between itself and the circuit boards. Therefore, the substrate connecting member is useful in the field of mobile electronic devices which require dense mounting of components.

The invention claimed is:

1. A substrate connecting member for connecting a first circuit board and a second circuit board, the substrate connecting member comprising:
   a frame member made of an insulating resin, the frame member comprising a frame side portion including a top surface configured to face the first circuit board, a bottom surface configured to face the second circuit board, and side surfaces orthogonal to the top surface and the bottom surface;
   a slit groove formed in at least one of an inner side surface and an outer side surface of the frame side portion composing the frame member, the slit groove being formed throughout an entire length of the frame side portion; and
   a connection conductor portion having a connection terminal on the top surface and a connection terminal on the bottom surface, respectively, of the frame side portion and a connecting conductor connecting the connection terminals.

2. The substrate connecting member of claim 1, wherein one of the following conditions is satisfied:
   the frame side portion has the connecting conductor of the connection conductor portion on an outer surface thereof and the slit groove in an inner surface thereof; and
   the frame side portion has the connecting conductor of the connection conductor portion on the inner surface thereof and the slit groove in the outer surface thereof.

3. The substrate connecting member of claim 1, wherein the slit groove is filled with a material having rubber elasticity.

4. A substrate connecting member for connecting a first circuit board and a second circuit board, the substrate connecting member comprising:
   a frame member made of an insulating resin, the frame member comprising a frame side portion including a top surface configured to face the first circuit board and a bottom surface configured to face the second circuit board;
   a thin-wall portion at both ends of a frame side portion composing the frame member, the thin-wall portion being smaller in thickness than a remaining portion of the frame side portion; and
   a connection conductor portion having a connection terminal disposed on the top surface and a connection terminal disposed on the bottom surface, respectively, of the frame side portion and a connecting conductor connecting the connection terminals.

5. The substrate connecting member of claim 4, wherein at least one more thin-wall portion is formed between the connection terminals on the frame side portion.

6. The substrate connecting member of claim 4, wherein the thin-wall portion is formed in a direction one of perpendicular and parallel to the thickness direction of the frame side portion.

7. The substrate connecting member of claim 4, wherein the thin-wall portion of the frame side portion is provided with a stepped portion filled with a material having rubber elasticity.

8. The substrate connecting member of claim 1 or 4, wherein
   the frame member has four frame side portions; and
   one set of two adjacent or opposing frame side portions are made of a material and another set of two adjacent or opposing frame side portions are made of another material.

9. The substrate connecting member of claim 1 or 4, wherein
   the frame side portion has a shield conductor on a side thereof, the side being opposite to a side having the connecting conductor thereon; and
   the shield conductor has a shield connection terminal on a same side as the connection terminal of the connection conductor portion.

10. The substrate connecting member of claim 1 or 4, wherein
   the frame member has opposing frame side portions, the opposing frame side portions being provided thereon with a same number of connection terminals as each other.

11. A connecting structure comprising:
   two circuit boards each having an electronic component mounted thereon, and
   a substrate connecting member connecting the two circuit boards together, the substrate connecting member being the substrate connecting member of claim 1 or 4.

* * * * *